(12) United States Patent
Lopez et al.

(10) Patent No.: US 9,768,368 B2
(45) Date of Patent: Sep. 19, 2017

(54) SIDE INTERCONNECT FOR LIGHT EMITTING DEVICE

(71) Applicant: Koninklijke Philips N.V., Eindhoven (NL)

(72) Inventors: Toni Lopez, San Jose, CA (US); Mark Melvin Butterworth, San Jose, CA (US); Theodoros Mihopoulos, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/296,935

(22) Filed: Oct. 18, 2016

(65) Prior Publication Data

US 2017/0040517 A1    Feb. 9, 2017

Related U.S. Application Data

(63) Continuation of application No. 14/786,522, filed as application No. PCT/IB2014/060617 on Apr. 10, 2014, now Pat. No. 9,577,151.

(Continued)

(51) Int. Cl.
| | |
|---|---|
| *H01L 33/62* | (2010.01) |
| *H01L 33/38* | (2010.01) |
| *H01L 33/40* | (2010.01) |
| *H01L 33/46* | (2010.01) |
| *H01L 33/50* | (2010.01) |

(52) U.S. Cl.
CPC ............ *H01L 33/62* (2013.01); *H01L 33/382* (2013.01); *H01L 33/385* (2013.01); *H01L 33/405* (2013.01); *H01L 33/46* (2013.01); *H01L 33/502* (2013.01); *H01L 2933/0016* (2013.01); *H01L 2933/0066* (2013.01)

(58) Field of Classification Search
CPC ..... H01L 33/405; H01L 33/46; H01L 33/502; H01L 33/62
See application file for complete search history.

(56) References Cited

U.S. PATENT DOCUMENTS

| | | | |
|---|---|---|---|
| 9,318,530 | B2 | 4/2016 | Jang et al. |
| 2009/0121241 | A1 | 5/2009 | Keller et al. |

(Continued)

FOREIGN PATENT DOCUMENTS

| | | |
|---|---|---|
| CN | 101165930 A | 4/2008 |
| CN | 101681969 A | 3/2010 |

(Continued)

OTHER PUBLICATIONS

EPO as ISA, PCT/IB2014/060617 filed Apr. 10, 2014, "International Search Report and Written Opinion" mailed Aug. 1, 2014, 10 pages.

(Continued)

*Primary Examiner* — Daniel Shook

(57) ABSTRACT

Embodiments of the invention include a semiconductor structure including a light emitting layer disposed between an n-type region and a p-type region. A metal n-contact is connected to the n-type region. A metal p-contact is in direct contact with the p-type region. An interconnect is electrically connected to one of the n-contact and the p-contact. The interconnect is disposed adjacent to the semiconductor structure.

20 Claims, 5 Drawing Sheets

Related U.S. Application Data

(60) Provisional application No. 61/814,940, filed on Apr. 23, 2013.

(56) References Cited

U.S. PATENT DOCUMENTS

| | | | |
|---|---|---|---|
| 2015/0200230 A1* | 7/2015 | Jang | H01L 27/156 257/91 |
| 2015/0243857 A1 | 8/2015 | Sabathil et al. | |

FOREIGN PATENT DOCUMENTS

| | | |
|---|---|---|
| CN | 101933166 A | 12/2010 |
| CN | 102110754 A | 6/2011 |
| CN | 102117821 A | 7/2011 |
| CN | 102646769 A | 8/2012 |
| DE | 102007030129 A1 | 1/2009 |
| EP | 1553640 A1 | 7/2005 |
| WO | 2004013916 A1 | 2/2004 |
| WO | 2013051326 A1 | 4/2013 |

OTHER PUBLICATIONS

EP Office Action dated Jan. 24, 2017, European Application No. 14721531.3, 4 pages.
TW Office Action dated Mar. 20, 2017, Taiwan Patent Application No. 103114737, 9 pages.
CN First Office Action dated May 4, 2017, China Patent Application No. 201480023174.8, 12 pages.

* cited by examiner

SIDE INTERCONNECT FOR LIGHT EMITTING DEVICE

CROSS-REFERENCE TO RELATED APPLICATIONS

The present application is a continuation of U.S. patent application Ser. No. 14/786,522, filed on Oct. 22, 2015 and entitled "Side Interconnect for Light Emitting Device," which is a §371 application of International Application No. PCT/IB2014/060617 filed on Apr. 10, 2014 and entitled "Side Interconnect for Light Emitting Device," which claims the benefit of U.S. Provisional Application No. 61/814,940, filed on Apr. 23, 2013. U.S. patent application Ser. No. 14/786,522, International Application No. PCT/IB2014/060617, and U.S. Provisional Application No. 61/814,940 are incorporated herein.

FIELD OF THE INVENTION

The present invention relates to a semiconductor light emitting device where at least one interconnect is disposed adjacent to the semiconductor structure rather than under the semiconductor structure.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a device described in U.S. Pat. No. 7,348,212. FIG. 1 illustrates a flip chip light emitting device attached to a mount. The flip chip device includes a substrate 73 attached to semiconductor device layers 74, which layers include at least one light emitting or active layer disposed between an n-type region and a p-type region. N-type contact 71 and p-type contact 72 are electrically connected to the n- and p-type regions of semiconductor structure 74. Semiconductor structure 74 is connected to mount 70 via contacts 71 and 72. A metal-to-metal interconnect to connect semiconductor structure 74 to mount 70 is formed by first forming thin metal layers 76b and 77b on mount 70 and thin metal layers 76a and 77a on contacts 71 and 72, then lithographically patterning the thin metal layers into the desired arrangement, resulting in thin metal regions in the desired shape. After patterning thin metal regions 76a, 77a, 76b, and 77b, thick ductile metal layers 78 and 79 are plated on either mount 70 or contacts 71 and 72, thus on either regions 76a and 77a or regions 76b and 77b. Metal layers 78 and 79 are selected to be ductile, have high thermal and electrical conductivity, and be reasonably resistant to oxidation. The semiconductor device is then positioned on mount 70 and the device and the mount are joined by any process that results in interdiffusion between thin metal layers 76a, 77a, 76b, and 77b and thick metal layers 78 and 79. Examples of suitable processes include thermosonic bonding and thermal compression bonding, where the device and mount are heated, for example to a temperature between 150 and 600° C., often 300 to 600° C., and pressed together, for example at a pressure between 10 and 200 N/mm2 of interconnect area.

SUMMARY

It is an object of the invention to provide a light emitting device with an interconnect disposed adjacent to the semiconductor structure, rather than beneath the semiconductor structure.

Embodiments of the invention include a semiconductor structure including a light emitting layer disposed between an n-type region and a p-type region. A metal n-contact is connected to the n-type region. A metal p-contact is in direct contact with the p-type region. An interconnect is electrically connected to one of the n-contact and the p-contact. The interconnect is disposed adjacent the semiconductor structure.

Embodiments of the invention include a semiconductor structure comprising a light emitting layer disposed between an n-type region and a p-type region. A metal n-contact is in direct contact with the n-type region. A metal p-contact is in direct contact with the p-type region. A first interconnect is electrically connected to one of the n-contact and the p-contact. A second interconnect is electrically connected to the other of the n-contact and the p-contact. The semiconductor structure is disposed above the first interconnect. No portion of the semiconductor structure is disposed above the second interconnect.

BRIEF DESCRIPTION OF THE DRAWINGS

Similar structures in different figures and labeled with the same reference number may be the same structure or structures that serves the same function.

DETAILED DESCRIPTION

Figure 1:
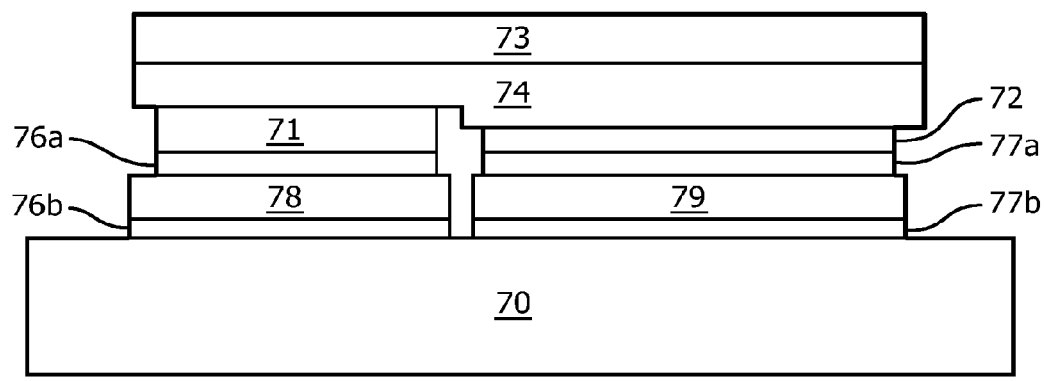
FIG. 1 illustrates a light emitting device with large area gold interconnects.

In the device illustrated in FIG. 1, the interconnects 78 and 79 are both disposed beneath the semiconductor structure 74. Interconnects 78 and 79 are typically electrically isolated from each other by a gap or a channel. Particularly in devices where growth substrate 73 is removed, the gap is often filled with an insulating material such as epoxy, in order to mechanically support semiconductor structure 74. Such filling materials often have very poor thermal conductivity, which limits the total thermal conductance of the interconnect structure and limits the amount of lateral thermal spreading in the interconnect structure, which can result in hot spots that may reduce device efficiency or even cause device failure. For example, in some devices thermo-mechanical induced cracking and other reliability problems occur in the channel.

In embodiments of the invention, at least one of the interconnects is disposed adjacent to or on the side of the semiconductor structure, rather than beneath the semiconductor structure.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figures 2, 3:
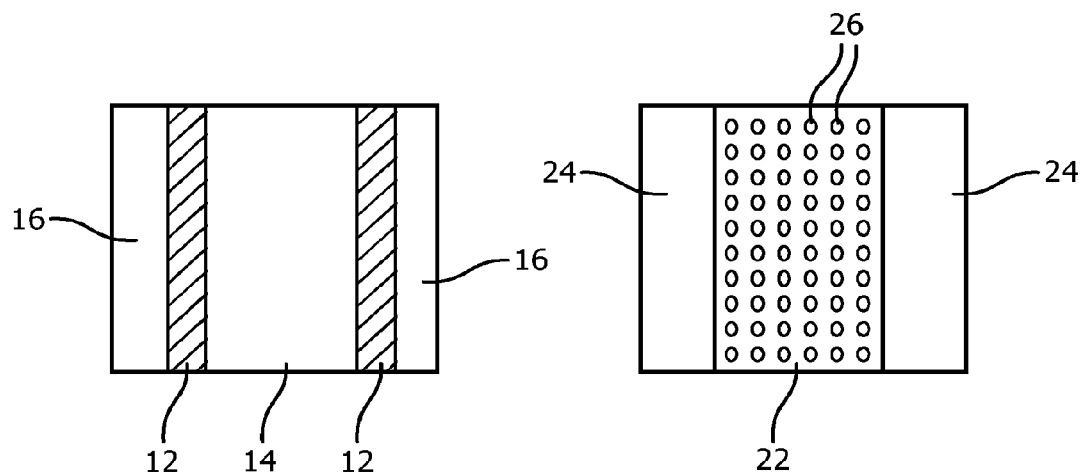
FIG. 2 is a bottom view of a light emitting device with a side interconnect.
FIG. 3 is a cross sectional view of the device illustrated in FIG. 2.
Figure 4:
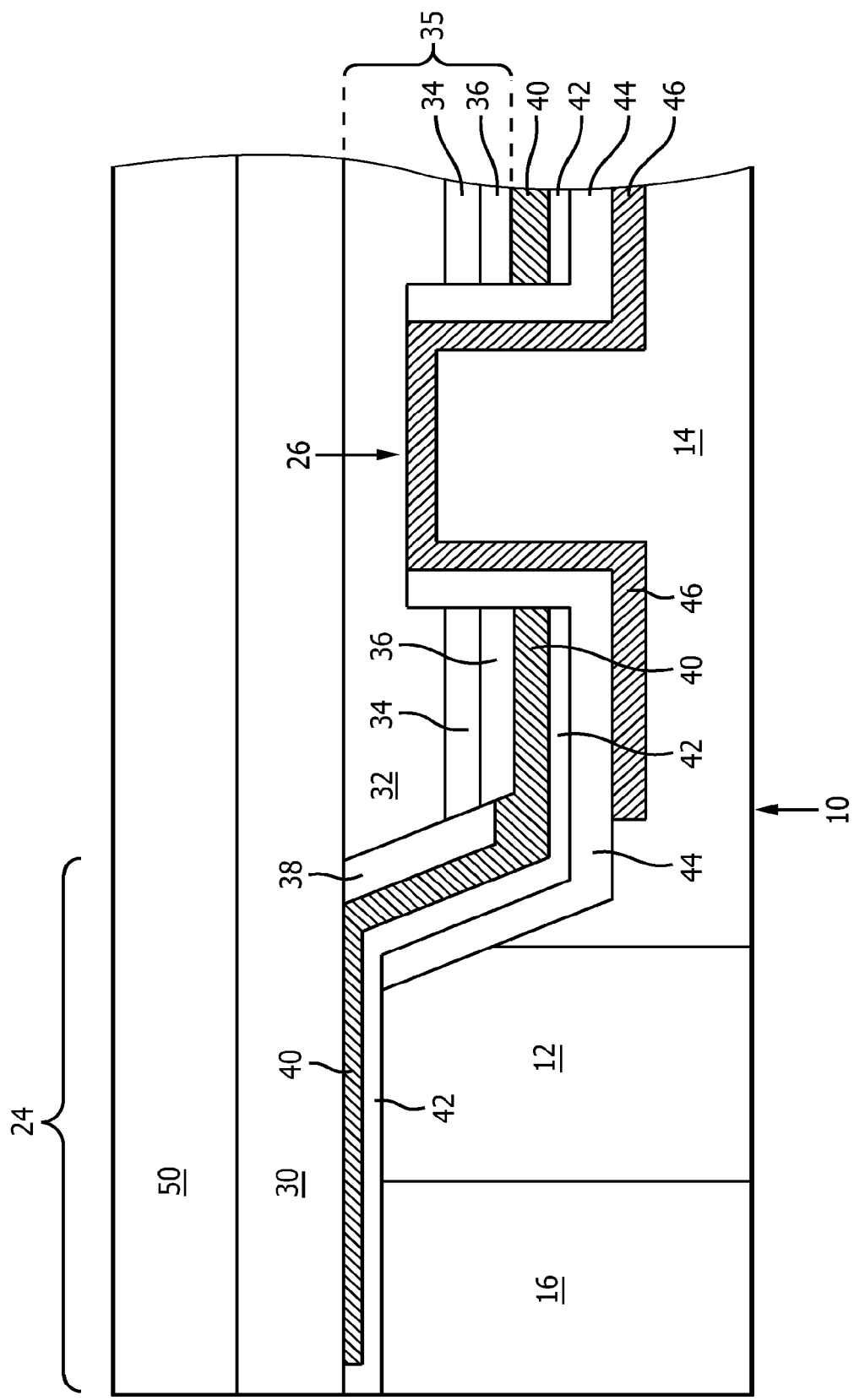
FIG. 4 is a cross sectional view of a portion of the device illustrated in FIGS. 2 and 3.

FIG. 2 illustrates a bottom view of a device according to embodiments of the invention. FIG. 3 illustrates a cross section view of the device of FIG. 2 parallel to the bottom view. FIG. 4 is a cross sectional view of a portion of the device illustrated in FIGS. 2 and 3 perpendicular to the bottom view.

FIG. 2 illustrates the interconnects arranged on the bottom surface of a light emitting device such as an LED. An n-interconnect 14 is electrically connected to the n-type region via an n-contact as illustrated in FIG. 4 and described below. The n-interconnect 14 is disposed beneath the semiconductor structure. Two p-interconnects 16 are disposed on either side of n-interconnect 14. A gap 12, which is often filled with a dielectric material, electrically isolates p-interconnects 16 from n-interconnect 14. The semiconductor structure including the light emitting region is removed from or not formed in the region of p-interconnects 16.

FIG. 3 illustrates the device of FIG. 2 viewed through the top. A wavelength converting material and growth substrate which may be part of the device and which are illustrated in FIG. 4 are not included in FIG. 3 for simplicity. The semiconductor structure 22 is a rectangle in the center of the device. In two regions 24 on either side of the semiconductor structure 22, the semiconductor structure is removed or is not formed. The regions 24 without semiconductor material are aligned with the gap 12 and p-interconnects 16 on the bottom of the structure.

The device illustrated in FIG. 3 is a flip chip device, i.e. both the n-contact and p-contact are formed on one side of the semiconductor structure and a majority of light is extracted through the other side of the semiconductor structure. Multiple vias 26 are illustrated in the semiconductor structure of FIG. 3. Vias 26 are etched through the semiconductor structure to expose a portion of the n-type region on which an n-contact may be formed. The p-contact is formed on the semiconductor areas surrounding vias 26. Though FIG. 3 illustrates a 6 by 10 array of n-contact vias, any suitable arrangement of the n-contact and p-contact may be made, including a single n-contact rather than an array of n-contact vias. In addition, n-contact regions 26 need not be elliptical as illustrated and may be any suitable shape including, for example, square, rectangular, or circular.

FIG. 4 is a cross sectional view of a portion of the device illustrated in FIGS. 2 and 3. The structures illustrated in FIG. 4 are not necessarily to scale. For example, structures like the semiconductor structure 35, p-metal layers 40 and 42, and n-metal layer 46 may be much thinner as compared to the p-interconnect 16 and n-interconnect 14 than depicted. Also, the depth of via 26 may be much smaller as compared to the p-interconnect 16 and n-interconnect 14 than depicted. As described above, FIG. 2 illustrates the bottom surface 10 of the device of FIG. 4. FIG. 3 is a cross sectional view taken at in the level of the via(s) 26 in FIG. 4.

The device illustrated in FIGS. 2, 3, and 4 is formed by growing a semiconductor structure 35 on a growth substrate 30, as is known in the art. The growth substrate 30 may be any suitable substrate such as, for example, sapphire, SiC, Si, GaN, or a composite substrate. In some embodiments, the thickness of growth substrate 30 is proportional to the square root of the total die area (including side interconnect areas described below). For a 1 mm2 die, the substrate thickness may be at least 200 µm thick in some embodiments. In some embodiments the surface of the substrate 30 on which the semiconductor structure is grown is roughened or patterned before growth, which may improve light extraction from the device. The semiconductor structure includes a light emitting or active region sandwiched between n- and p-type regions. An n-type region 32 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 34 is grown over the n-type region. Examples of suitable light emitting regions include a single thick or thin light emitting layer, or a multiple quantum well light emitting region including multiple thin or thick light emitting layers separated by barrier layers. A p-type region 36 may then be grown over the light emitting region. Like the n-type region, the p-type region may include multiple layers of different composition, thickness, and dopant concentration, including layers that are not intentionally doped, or n-type layers. The structure in FIG. 4 is shown flipped over relative to the growth direction of the semiconductor structure.

After growth of the semiconductor structure, in region 24 at the edge of the device, the entire thickness of the semiconductor structure is etched away to reveal the growth substrate 30. A dielectric 38 such as an oxide or nitride of silicon or any other suitable material may be formed and patterned to electrically isolate the edge of the etched region. (FIG. 4 illustrates a device with an insulating substrate and therefore shows dielectric 38 isolating only the edge of the semiconductor structure 35. Dielectric 38 may cover the entire edge of the semiconductor structure 35 or it may extend over a portion of the edge which includes the active region. In a device with a conductive substrate, in region 24, dielectric 38 extends between substrate 30 and reflective p-metal 40, to prevent the p-interconnect 16 from short-circuiting the device through substrate 30.) Regions 24 and vias 26 may be formed in separate etching steps, as described below, or they may be formed in the same etching step. After forming dielectric 38, a p-contact is formed over the semiconductor structure 35, over the dielectric 38, and over the exposed surface of the growth substrate 30 in region 24. As illustrated in FIG. 4, the p-contact includes a reflective metal 40 formed on the p-type region 36. Reflective metal 40 is often silver but may be any suitable metal or a multi-layer stack. A guard metal 42 may be disposed over the reflective metal 40. Guard metal 42 prevents or reduces electromigration of the reflective metal 40. Guard metal 42 may extend over the edge of reflective metal 40 as illustrated in FIG. 4 in order to encapsulate the reflective metal 40. The reflective metal 40 covers the side wall of the semiconductor structure 35, and therefore may improve light extraction from the device.

After the p-contact is formed, vias 26 are etched through the p-contact metals, the p-type region 36, and the active region 34 to expose a portion of the n-type region 32. The sidewalls of vias 26 may be lined with a dielectric 44 to prevent shorting of the active region 34. Dielectric 44 may be an oxide or nitride of silicon or any other suitable material. An n-contact metal 46 is formed over dielectric 44 and in in direct contact with n-type region 32. The electrical connection of n-contact metal to n-type region 32 may be inside or at the bottom of vias 26. N-contact metal 46 is often aluminum though any suitable metal or a multi-layer stack may be used.

A thick metal layer which will form n-interconnect 14 and p-interconnects 16 is disposed on the structure after n-contact metal 46. Interconnects 14 and 16 may be gold, copper, or any other suitable metal including a multi-layer stack. In some embodiments, interconnects 14 and 16 are reflective. For example, interconnects 14 and 16 may be made reflective in order to increase the reflectance of the side-walls of the interconnects. The top surface of interconnect 16 closest to substrate 30 is coated with a highly reflective material 40 (the reflective p-contact metal) and guard metal 42. Reflective metal 40 may increase reflectivity of light inside the substrate.

Figure 7:
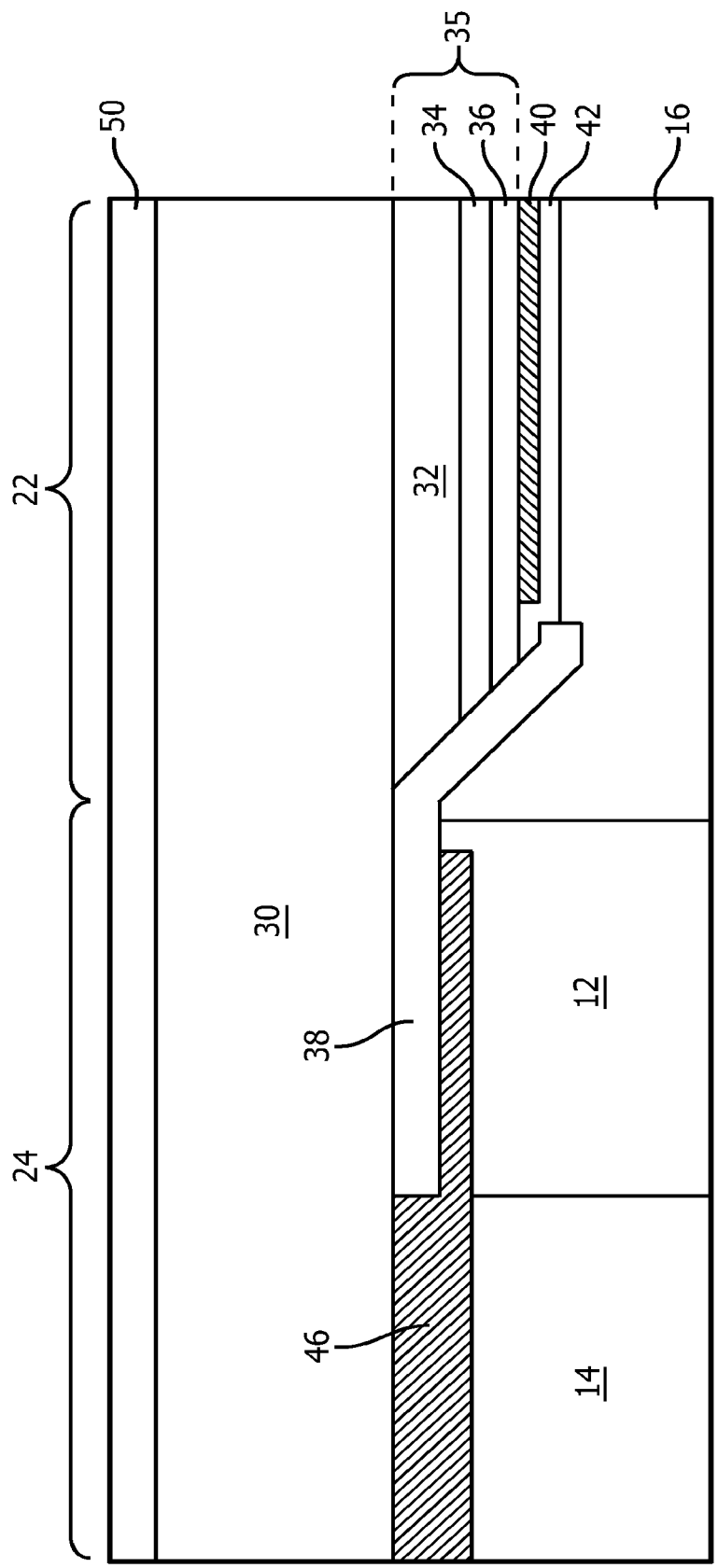
FIG. 7 is a cross sectional view of a portion of the device with a conductive substrate and a side interconnect.

The thick metal layer is patterned to open a gap 12 that electrically isolates n-interconnect 14 from p-interconnects 16. Gap 12 may be filled with a dielectric such as silicone, epoxy, polymer, an organic material, benzocyclobutene (BCB), or any other appropriate material. In some embodiments, gap 12 is filled with a dielectric such as BCB that avoids cracking and other reliability related issues due to thermo-mechanical problems. N-interconnect 14 is in electrical contact with n-contact metal 46 and is electrically isolated from the p-metals 40 and 42 by dielectric layer 44. P-interconnects 16 are in electrical contact with p-metals 40 and 42 and are electrically isolated from n-contact metal 46 by gap 12. The side interconnect or interconnects (p-interconnects 16 in the device of FIGS. 2-4) may be at least 300 μm wide in some embodiments and no more than 500 μm wide in some embodiments. Gap 12 may be at least 100 μm wide in some embodiments and no more than 300 μm wide in some embodiments. Interconnects 14 and 16 are used to electrically connect the LED to an external structure such as a printed circuit board or any other suitable structure. In some embodiments, the polarity of the interconnects 14 and 16 is reversed such that the side interconnect 16 is electrically connected to the n-type region and the other interconnect 14 is electrically connected to the p-type region. The polarity of the interconnects 14 and 16 may be reversed from the arrangement shown in FIG. 4 by appropriately patterning dielectrics 38 and 44 and gap 12. One or more additional dielectric and/or metal layers may be required. The etching steps described and illustrated may be modified, or one or more additional etching steps may be included. One example of a device with the polarity of the interconnects 14 and 16 reversed from the arrangement shown in FIG. 4 is illustrated in FIG. 7.

A structure 50 which may include, for example, one or more of a wavelength converting material, a filter, and optical structures such as lenses may be disposed over growth substrate 30. In some embodiments, growth substrate 30 remains part of the final device. In other embodiments, growth substrate 30 is thinned or entirely removed from the semiconductor structure 35.

As illustrated in FIG. 4, the semiconductor structure 35 is disposed between n-interconnect 14 and growth substrate 30, or between n-interconnect 14 and wavelength converting material 50 where the growth substrate 30 is removed. No semiconductor structure is disposed between p-interconnect 16 and growth substrate 30, or between p-interconnect 16 and wavelength converting material 50. The p-interconnect 16 is confined to a region with no semiconductor material.

Figure 5:
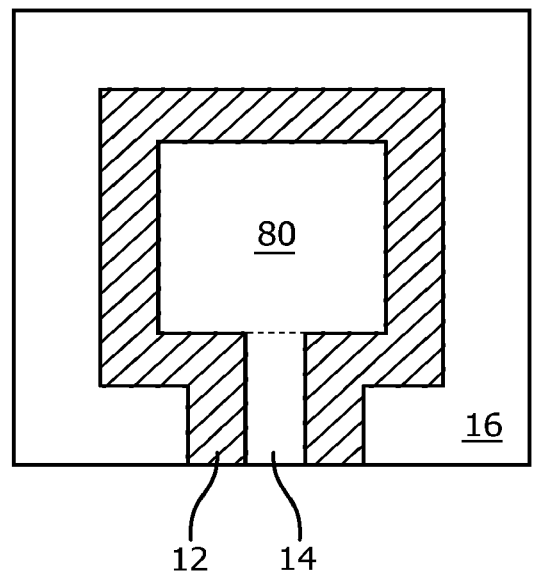
FIGS. 5 and 6 illustrate alternative arrangements for side interconnects.
Figure 6:
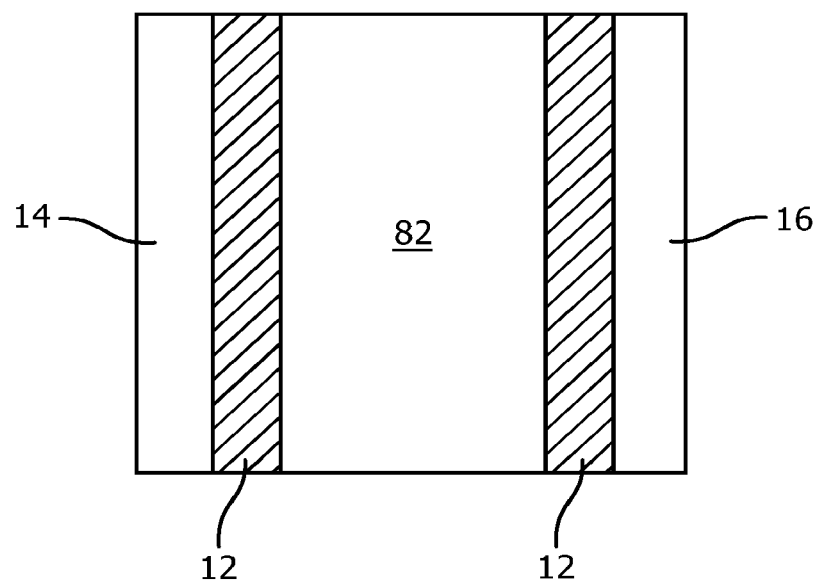

The interconnects are not limited to the arrangement illustrated in FIG. 2. FIGS. 5 and 6 illustrate the bottoms of devices with alternative arrangements of interconnects. In the device illustrated in FIG. 5, the semiconductor structure is disposed in the square 80 at the center of the device. The p-interconnect 16 is disposed on three sides of the semiconductor structure and substantially surrounds the semiconductor structure. The n-interconnect 14 is disposed on one side of the semiconductor structure. The n-interconnect 14 extends beneath the entire semiconductor structure 80 in the arrangement illustrated in FIG. 5, though it need not.

In the device illustrated in FIG. 6, the semiconductor structure is disposed in the rectangle 82 at the center of the device. The n-interconnect 14 is disposed on one side of the semiconductor structure and the p-interconnect 16 is disposed on the other side of the semiconductor structure. The area 82 directly beneath the semiconductor structure may be used for heat sinking and may not be electrically involved in the device.

The interconnect arrangements illustrated in FIGS. 5 and 6 may be made by appropriately patterning dielectrics 38 and 44 and gap 12. The etching steps described and illustrated may be modified, or one or more additional etching steps may be included. In some embodiments, one or more additional dielectric or metal layers may be used in order to arrange the p-interconnect and n-interconnect as desired.

Figure 8:
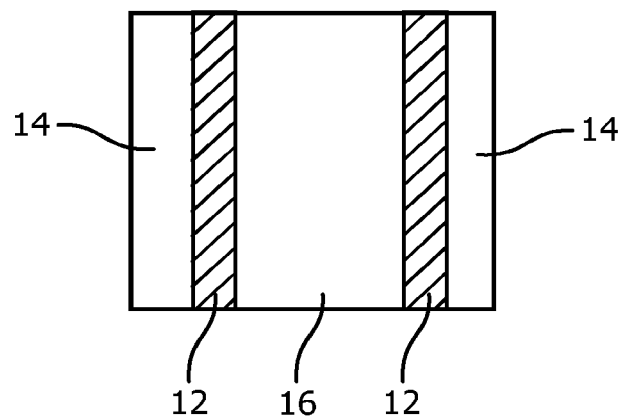
FIG. 8 is a bottom view of a light emitting device with a side interconnect, partially illustrated in cross section in FIG. 7.
Figure 9:
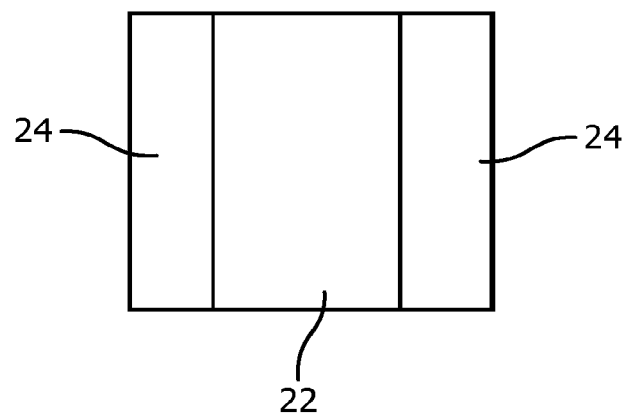
FIG. 9 is a top view of the device illustrated in FIG. 8.

FIG. 8 illustrates a bottom view of a device with a conductive substrate, according to embodiments of the invention. FIG. 9 illustrates a top view of the device of FIG. 8. FIG. 7 is a cross sectional view of a portion of the device illustrated in FIGS. 8 and 9.

As illustrated in FIG. 8, the n-interconnect 14 is disposed in region 24, the region where the semiconductor structure 35 is removed from substrate 30. The p-interconnect 16 is disposed beneath the semiconductor structure 35 in region 22, shown in FIG. 9. N- and p-interconnects 14 and 16 are electrically isolated from each other by gap 12, which may be filled with a dielectric as described above.

The structure illustrated in FIG. 7 is formed in a similar manner as the structure illustrated in FIG. 4. The p-contact reflective metal 40 and guard metal 42 are formed on p-type region 36. A dielectric layer 38 is formed to isolate the etched edge of semiconductor structure 35. Dielectric 38 extends along a portion of growth substrate 30 in region 24 where the semiconductor structure 35 is removed.

The n-contact metal 46 is formed in region 24, in direct contact with conductive substrate 30. N-contact metal 46 is electrically isolated from p-contact metals 40 and 42 by dielectric 38. When the device is forward biased, electrons flow from the n-interconnect 14 through n-contact 46, through conductive substrate 30, through n-type region 32, to light emitting region 34. Holes flow from p-interconnect 16 through p-contact metals 40 and 42, through p-type region 36, to light emitting region 34. As illustrated in FIG.

9, no vias are needed. Accordingly, the device illustrated in FIG. 7 may have more light emitting region area than a similarly sized device with vias formed to accommodate n-contact metals, as illustrated in FIG. 4.

In some of the embodiments described herein, the reflectivity of the LED is improved as compared to conventional devices without side interconnects. For example, regions 24 in FIG. 3 are highly reflective, even more reflective than region 22 in some embodiments, because the reflective material 40 adjacent to the substrate 30 (illustrated in FIG. 4) is very reflective. The reflectivity in regions 24 may be further improved by disposing a distributed Bragg reflector (DBR) between reflective material 40 and substrate 30. To form a DBR, an alternating stack of layers of different refractive indices as is known in the art is disposed between reflective material 40 and the substrate 30. A DBR can be tuned to reflect light and/or to direct light in particular directions for example to enhance light extraction from the substrate 30 into the ambient or into structure 50.

The side interconnects described herein may have several advantages. Because all or nearly all of the space beneath the semiconductor structure is occupied by an interconnect or other thermally conductive structure, the device may have lower thermal resistance than a device such as the device of FIG. 1 that includes beneath the semiconductor structure a gap to electrically isolate the interconnects. Lateral thermal spreading may be enhanced and hot spots may be reduced or eliminated. The reflective p-contact metal in the region where the semiconductor structure is removed from the substrate may improve light extraction from the device, for example by reflecting light that is backscattered by a wavelength converting layer. The growth substrate and/or the interconnect beneath the semiconductor structure may mechanically support the semiconductor structure without any gaps, which may prevent or reduce the occurrence of failure mechanisms associated with an unsupported semiconductor structure. Also, since at most only one interconnect is disposed beneath the semiconductor structure, the n-contact design is flexible and may be optimized for current spreading through the n-layer (for example with a large number of small contact vias as illustrated in FIG. 3).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A light emitting device comprising:
a semiconductor structure comprising a light emitting layer disposed between an n-type region and a p-type region;
a conductive growth substrate in direct contact with the semiconductor structure;
a metal n-contact connected to the n-type region and a metal p-contact in direct contact with the p-type region; and
an interconnect in direct contact with one of the n-contact and the p-contact, wherein the interconnect is disposed adjacent to the semiconductor structure and no semiconductor material is disposed between any portion of the interconnect and the growth substrate.

2. The light emitting device of claim 1 wherein the metal n-contact is disposed between the growth substrate and the interconnect in direct contact with the growth substrate.

3. The light emitting device of claim 1 wherein the interconnect is a first interconnect, the device further comprising a second interconnect electrically connected to the other of the n-contact and the p-contact, wherein the semiconductor structure is disposed between the second interconnect and the growth substrate.

4. The light emitting device of claim 3 wherein the second interconnect is disposed beneath the entire semiconductor structure.

5. The light emitting device of claim 3 wherein the first interconnect is electrically connected to the n-contact and the second interconnect is electrically connected to the p-contact.

6. The light emitting device of claim 1 further comprising a wavelength converting material disposed above the conductive growth substrate.

7. The light emitting device of claim 1 wherein the interconnect is reflective.

8. The light emitting device of claim 1 wherein the interconnect is a different material from the n-contact and the p-contact.

9. A semiconductor light emitting device comprising:
a semiconductor structure comprising a light emitting layer disposed between an n-type region and a p-type region;
a metal n-contact in direct contact with the n-type region and a metal p-contact in direct contact with the p-type region; and
a first interconnect electrically connected to one of the n-contact and the p-contact and a second interconnect electrically connected to the other of the n-contact and the p-contact, wherein the semiconductor structure is disposed above the first interconnect and no semiconductor structure is disposed above any portion of the second interconnect, wherein the first and second interconnects are different materials from the metal n-contact and the metal p-contact.

10. The semiconductor light emitting device of claim 9 wherein:
the n-contact comprises aluminum;
the p-contact comprises silver; and
the first and second interconnects comprise one of copper and gold.

11. The semiconductor light emitting device of claim 9 further comprising a growth substrate in direct contact with the semiconductor structure and disposed over the second interconnect.

12. The semiconductor light emitting device of claim 11 further comprising a wavelength converting material disposed above the growth substrate.

13. The semiconductor light emitting device of claim 9 wherein the p-contact is disposed over a sidewall of the semiconductor structure and over the second interconnect.

14. The semiconductor light emitting device of claim 13 wherein the p-contact is disposed between a distributed Bragg reflector and the second interconnect.

15. A semiconductor light emitting device comprising:
a semiconductor structure comprising a light emitting layer disposed between an n-type region and a p-type region;
a metal n-contact in direct contact with the n-type region and a metal p-contact in direct contact with the p-type region; and
a first interconnect electrically connected to one of the n-contact and the p-contact and a second interconnect electrically connected to the other of the n-contact and the p-contact, wherein the semiconductor structure is disposed above the first interconnect and no semiconductor structure is disposed above any portion of the second interconnect; and a growth substrate in direct contact with the semiconductor structure, wherein the growth substrate is disposed over the first and second interconnects.

16. The semiconductor light emitting device of claim 15 wherein the first and second interconnects are different materials from the metal n-contact and the metal p-contact.

17. The semiconductor light emitting device of claim 16 wherein:
the n-contact comprises aluminum;
the p-contact comprises silver; and
the first and second interconnects comprise one of copper and gold.

18. The semiconductor light emitting device of claim 15 further comprising a wavelength converting material disposed above the growth substrate.

19. The semiconductor light emitting device of claim 15 wherein one of the first and second interconnects are reflective.

20. A light emitting device comprising:

a semiconductor structure comprising a light emitting layer disposed between an n-type region and a p-type region;

a conductive growth substrate in direct contact with the semiconductor structure;

a metal n-contact connected to the n-type region and in direct contact with the growth substrate, and a metal p-contact in direct contact with the p-type region; and an interconnect in direct contact with one of the n-contact and the p-contact, wherein the interconnect is disposed adjacent to the semiconductor structure.

* * * * *